(12) United States Patent
Hamilton et al.

(10) Patent No.: US 11,024,820 B2
(45) Date of Patent: Jun. 1, 2021

(54) PHOTO-PATTERNED EMISSIVE LAYER CONTAINING PASSIVATED QUANTUM DOTS, ARRANGEMENT OF LIGHT-EMITTING DEVICES INCLUDING SAME, AND METHOD OF MAKING SAME

(71) Applicant: SHARP KABUSHIKI KAISHA, Osaka (JP)

(72) Inventors: Iain Hamilton, Oxford (GB); Tim Michael Smeeton, Oxford (GB); Enrico Angioni, Oxford (GB)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/535,241

(22) Filed: Aug. 8, 2019

(65) Prior Publication Data

US 2021/0043862 A1 Feb. 11, 2021

(51) Int. Cl.
*H01L 51/50* (2006.01)
*H01L 21/02* (2006.01)

(52) U.S. Cl.
CPC ...... *H01L 51/502* (2013.01); *H01L 21/02568* (2013.01); *H01L 21/02601* (2013.01); *H01L 21/02628* (2013.01)

(58) Field of Classification Search
CPC .......... H01L 21/502; H01L 21/02568
See application file for complete search history.

(56) References Cited

U.S. PATENT DOCUMENTS

| 7,910,400 | B2 | 3/2011 | Kwon et al. |
| 9,324,562 | B1 | 4/2016 | Luther et al. |
| 2013/0019930 | A1 | 1/2013 | Semonin et al. |
| 2017/0155051 | A1 | 6/2017 | Torres Cano et al. |

(Continued)

FOREIGN PATENT DOCUMENTS

WO   WO 2017/121163   7/2017

OTHER PUBLICATIONS

Park et al., "Alternative Patterning Process for Realization of Large-Area, Full-Color, Active Quantum Dot Display", Nano Letters, 2016, pp. 6946-6953.

(Continued)

*Primary Examiner* — Marc Anthony Armand
(74) *Attorney, Agent, or Firm* — Renner, Otto, Boisselle & Sklar, LLP

(57) ABSTRACT

A method is disclosed for forming an emissive layer of a light-emitting device. One or more layers of the light-emitting device are formed. A solution including quantum dots having ligands at the outer surface thereof is contacted with the uppermost layer of the light-emitting device. A portion of the solution is subjected to external activation stimuli to form a crosslinked layer on the uppermost formed layer of the light-emitting device, the crosslinked layer including the ligands at the outer surface of the quantum dots in a crosslinked state. The solution is washed away, and the crosslinked layer is contacted with ligand exchange solution including compact ligands to perform a ligand exchange. Also disclosed is a light-emitting device including an anode, (Continued)

cathode, and emissive layer disposed therebetween, the emissive layer including quantum dots and compact ligands at the outer surface thereof.

12 Claims, 7 Drawing Sheets

(56) References Cited

U.S. PATENT DOCUMENTS

2019/0115507 A1* 4/2019 Kim .................. H01L 51/5206
2019/0259962 A1* 8/2019 Lee .................... H01L 51/502

OTHER PUBLICATIONS

Li et al., "Bright colloidal quantum dot light-emitting diodes enabled by efficient chlorination", Nature Photonics, vol. 12, Mar. 2018, pp. 159-164.
Kang et al., "Efficient exciton generation in atomic passivated CdSe/ZnS quantum dots light-emitting devices", Scientific Reports 6, 34659; doi: 10.1038/srep34659 (2016).
Tang et al., "Colloidal-quantum-dot photovoltaics using atomic-ligand passivation", Nature Materials, vol. 10, Oct. 2011, pp. 765-771.

* cited by examiner

PHOTO-PATTERNED EMISSIVE LAYER CONTAINING PASSIVATED QUANTUM DOTS, ARRANGEMENT OF LIGHT-EMITTING DEVICES INCLUDING SAME, AND METHOD OF MAKING SAME

TECHNICAL FIELD

The invention relates to light-emitting devices, and in particular to light-emitting devices including a photo-patterned emissive layer containing quantum dots having compact ligands, and arrangements thereof. The light-emitting devices may be implemented in display applications, for example high resolution, multicolor displays. The invention further relates to methods of manufacturing said light-emitting devices and the arrangements thereof.

BACKGROUND ART

A common architecture for a light-emitting device includes an anode, which acts as a hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which emits light.

When the emissive material layer includes an organic material, the light-emitting device is referred to as an organic light-emitting diode (OLED). When the emissive material layer includes nanoparticles, sometimes known as quantum dots (QDs), the device is commonly called either a quantum dot light-emitting diode (QLED, QD-LED) or an electroluminescent quantum dot light-emitting diode (ELQLED). QDs generally include ligands bound to their outer surface. The ligands allow the QDs to be solution processed, and may provide for the passivation of the QD surface to which the ligands are bound.

In order to include QLEDs in multicolor high-resolution displays, different manufacturing methods have been designed. These methods are based on disposing three different types of QDs in three different regions of a substrate such that they emit (through electrical injection, i.e., by electroluminescence) at three different colors: red (R), green (G), and blue (B). Sub-pixels that respectively emit red, green, or blue light may collectively form a pixel, which in-turn may be a part of an array of pixels of the display.

Using quantum dots in the emissive layer may offer advantages such as potential for longer operating lifetime, operation at higher current densities, and narrow emission profiles allowing for high color purity. Also, a wide range of different colors may be achieved by controlling the size and composition of the QDs. In addition, quantum dots may be solution processed, which is an advantage over vacuum-deposited organic materials. However, existing organic light-emitting devices include crystal defects at the surface of the QD that cause non-radiative recombination. Moreover, existing organic light-emitting devices include long-chain, electrically insulating, organic ligands bound to the QD that cause imperfect passivation of defects on the QDs and also hinder charge transport and injection within the device. There is a need in the market for a light-emitting device with improved defect passivation, charge transport, and lifetime within the QLED. There is also a need to be able to produce such lighting devices in a manner that allows for them to be effectively utilized in applications such as high resolution displays.

United States Patent Application Publication No. US 2017/0155051 (Torres Cano et al., published Jun. 1, 2017) describes a method of forming an insoluble, crosslinked QD network by using QDs passivated with reactive polythiol ligands. The polythiol ligands bound to one particular QD can crosslink with another polythiol ligand bound to an adjacent QD via thermal curing.

U.S. Pat. No. 7,910,400 (Kwon et al., published Mar. 22, 2011) describes a solution processed method of forming a crosslinked emissive layer by applying a cross-link agent (e.g., thiol, amine, carboxyl functional groups) to cross-link the quantum dots after the emissive layer has already been deposited.

International Application Publication No. WO 2017/121163 (Li et al., published Jul. 20, 2017) describes QDs with R, G, and B emission colors that can be patterned separately using cross-linkable ligands and organic connectors through chemistry reactions that are activated using UV radiation at different monochromatic wavelengths.

Park et al., *Alternative Patterning Process for Realization of Large-Area, Full-Color, Active Quantum Dot Display*, Nano Letters, 2016, pages 6946-6953 describes that QDs with R, G, and B emission colors are patterned by combining conventional photolithography and layer by layer assembly. Emissive layers are deposited selectively on activated (charged) surfaces.

U.S. Pat. No. 9,324,562 (Luther et al., published Apr. 26, 2016) describes a solid-state ligand exchange in which organic ligand passivated QDs are deposited onto a substrate before being contacted with a metal halide salt solution. The organic ligands are then exchanged with the halide ions to form an inorganic ligand-passivated emissive layer.

United States Patent Application Publication No. US 2013/0019930 (Semonin et al., published Jan. 24, 2013) describes a process where a deposition surface is alternately contacted with a ligand exchange chemical and a QD colloid. This process is repeated over one or more cycles to form a QD film on the deposition surface.

Li et al., *Bright colloidal quantum dot light-emitting diodes enabled by efficient chlorination*, Nature Photonics, Vol. 12, March 2018, pages 159-164 describes a method of replacing long chain oleic acid ligands bound to QDs with chloride ions by reaction with a chlorinating agent thionyl chloride. Other examples of ligand exchange agents replacing organic ligands with halogens include cetyl trimethyl-ammonium bromide (CTAB) for bromine (see Kang et al., *Efficient exciton generation in atomic passivated CdSe/ZnS quantum dots light-emitting devices*, Scientific Reports 6, 34659; doi: 10.1038/srep34659 (2016)) and tetrabutylam-monium iodide (TBAI) for iodine (see Tang et al., *Colloidal-quantum-dot photovoltaics using atomic-ligand passivation*, Nature Materials, Vol. 10, October 2011, pages 765-771).

CITATION LIST

US 2013/0019930 (Semonin et al., published Jan. 24, 2013).
US 2017/0155051 (Torres Cano et al., published Jun. 1, 2017).
U.S. Pat. No. 7,910,400 (Kwon et al., published Mar. 22, 2011).
U.S. Pat. No. 9,324,562 (Luther et al., published Apr. 26, 2016).
WO 2017/121163 (Li et al., published Jul. 20, 2017).

Park et al., *Alternative Patterning Process for Realization of Large-Area, Full-Color, Active Quantum Dot Display*, Nano Letters, 2016, pages 6946-6953.

Li et al., *Bright colloidal quantum dot light-emitting diodes enabled by efficient chlorination*, Nature Photonics, Vol. 12, March 2018, pages 159-164.

Kang et al., *Efficient exciton generation in atomic passivated CdSe/ZnS quantum dots light-emitting devices*, Scientific Reports 6, 34659; doi: 10.1038/srep34659 (2016).

Tang et al., *Colloidal-quantum-dot photovoltaics using atomic-ligand passivation*, Nature Materials, Vol. 10, October 2011, pages 765-771.

SUMMARY OF INVENTION

In accordance with the present disclosure, a structure for and methods of producing a light-emitting device with a sub-pixel arrangement including QDs having compact ligands (e.g., short chain organic ligands, inorganic molecular ligands, and/or inorganic ion ligands) may provide improved QLED efficiency and stability as compared to devices including QDs with conventional organic long chain ligands. For example, the replacement of the organic component of the emissive layer with compact ligands may improve the long-term stability and performance of the light-emitting device. As another example, the smaller ligand size of the compact ligands may allow for increased passivation of the QDs because more ligands may be able to coordinate onto the QDs. Increased and more extensive passivation may reduce defects on the QD surface. Using smaller ligands may also reduce the separation between adjacent QDs, which may provide for denser, improved packing within the emissive layer. The void between QDs may be reduced, which may improve charge transport properties within the QLED.

Methods of producing the structure may also allow for sub-pixels to be patterned that are smaller than those attainable by conventional production methods such as inkjet printing. For example, a method of producing a light-emitting device involving ligands with cross-linkable moieties and exchangeable binding moieties may allow for high resolution sub-pixels to be fabricated using a process such as UV lithography. In some embodiments, sub-pixels may be fabricated having a size that allows for a pixel density of at least 500 ppi. In other embodiments, sub-pixels may be fabricated having a size that allows for a pixel density falling in a range of 500 ppi 2000 ppi.

In accordance with an aspect of the present disclosure, a method of forming an emissive layer of a light-emitting device, includes: forming one or more layers of the light-emitting device on a substrate; contacting a quantum dot solution including quantum dots having ligands at the outer surface thereof dispersed in a solvent with the uppermost formed layer of the light-emitting device; subjecting a portion of the quantum dot solution to external activation stimuli to form a crosslinked layer on the uppermost formed layer of the light-emitting device, the crosslinked layer including a crosslinked matrix including the quantum dots and the ligands at the outer surface of the quantum dots in a crosslinked state; washing away the quantum dot solution not forming the crosslinked layer; and contacting the crosslinked layer with a ligand exchange solution including compact ligands to perform a ligand exchange to exchange at least a portion of the crosslinked ligands with the compact ligands.

In some embodiments, the compact ligands include at least one of short chain organic ligands, inorganic molecular ligands, and inorganic ion ligands.

In some embodiments, the compact ligands include one or more of a halide, chalcogenide, or thiocyanate.

In some embodiments, the quantum dot solution includes at least one photo-initiator.

In some embodiments, before subjecting the portion of the quantum dot solution to external activation stimuli, the ligands include a cross-linkable moiety and an exchangeable binding moiety. In some embodiments, the external activation stimuli is UV light, and the cross-linkable moiety before UV-exposure includes an oxetan group or a vinylbenzyl group. In some embodiments, the exchangeable binding moiety includes a carboxylic acid group or thiol group.

In some embodiments, the forming one or more layers of the light-emitting device on the substrate includes: forming an electrode on the substrate; and forming one or more charge transport layers on the electrode.

In some embodiments, at least 50% of the crosslinked ligands are exchanged with the compact ligands.

In some embodiments, the light-emitting device is a first light emitting device of light-emitting devices arranged in a sub-pixel arrangement, and when the quantum dot solution is contacted with the uppermost formed layer of the first light-emitting device, the quantum dot solution is also contacted with an uppermost formed layer of a second light-emitting device.

In some embodiments, the quantum dot solution contacted with the uppermost formed layer of the second light-emitting device is not subjected to external activation stimuli.

In accordance with another aspect of the present disclosure, a method of forming emissive layers of light-emitting devices arranged in a sub-pixel arrangement includes: forming one or more layers of a first light-emitting device on a substrate in a first sub-pixel region and one or more layers of a second light-emitting device on the substrate in a second sub-pixel region; contacting a first quantum dot solution including first quantum dots having first ligands at the outer surface thereof dispersed in a first solvent with the uppermost formed layer of the first light-emitting device and the uppermost formed layer of the second light-emitting device, wherein the first ligands are cross-linkable; subjecting a portion of the first quantum dot solution to external activation stimuli to form a first crosslinked layer on the uppermost formed layer of the first light-emitting device, the first crosslinked layer including a first crosslinked matrix including the first quantum dots and the first ligands at the outer surface the first quantum dots in a crosslinked state; washing away the first quantum dot solution not forming the first crosslinked layer; contacting a second quantum dot solution including second quantum dots having second ligands at the outer surface thereof dispersed in a second solvent with the uppermost formed layer of the second light-emitting device and one or more of the formed layers of the first light-emitting device, wherein the second ligands are cross-linkable; subjecting at least a portion of the second quantum dot solution to external activation stimuli to form a second crosslinked layer on the uppermost formed layer of the second light-emitting device, the second crosslinked layer including a second crosslinked matrix including the second quantum dots and the second ligands at the outer surface the second quantum dots in a crosslinked state; and washing away the second quantum dot solution not forming the second crosslinked layer, wherein ligand exchange is performed to exchange at least a portion of the first crosslinked ligands and at least a portion of the second crosslinked ligands with compact ligands.

In some embodiments, the ligand exchange includes contacting the first crosslinked layer and the second crosslinked layer with a ligand exchange solution including compact ligands to perform a ligand exchange to exchange at least a portion of the first crosslinked ligands and at least a portion of the second crosslinked ligands with the compact ligands.

In some embodiments, the ligand exchange includes: contacting the first crosslinked layer with a first ligand exchange solution including first compact ligands to perform a ligand exchange to exchange at least a portion of the first crosslinked ligands with the first compact ligands; and contacting the first crosslinked layer and the second crosslinked layer with a second ligand exchange solution including compact second ligands to perform a ligand exchange to exchange at least a portion of the second crosslinked ligands with the second compact ligands.

In some embodiments, a light-emitting device, includes: an anode; a cathode; and an emissive layer disposed between the anode and the cathode, the emissive layer including quantum dots and a mixture of compact ligands and additional ligands other than the compact ligands at the outer surface the quantum dots.

In some embodiments, the mixture includes at least 50% compact ligands.

In some embodiments, the compact ligands include at least one of short chain organic ligands, inorganic molecular ligands, and inorganic ion ligands.

In some embodiments, the additional ligands other than the compact ligands include crosslinked ligands.

In some embodiments, before crosslinking, the ligands include an oxetan group or a vinylbenzyl group.

In some embodiments, the light-emitting device is a first light-emitting device provided in a first sub-pixel region of a sub-pixel arrangement of light-emitting devices, the sub-pixel arrangement further including: a second light-emitting device provided in a second sub-pixel region of the sub-pixel arrangement, the second light emitting device including an anode, a cathode, and an emissive layer disposed between the anode and the cathode, the emissive layer including quantum dots and compact ligands at the outer surface the second quantum dots.

The foregoing and other features of the invention are hereinafter described in greater detail with reference to the accompanying drawings.

DESCRIPTION

Figure 1:
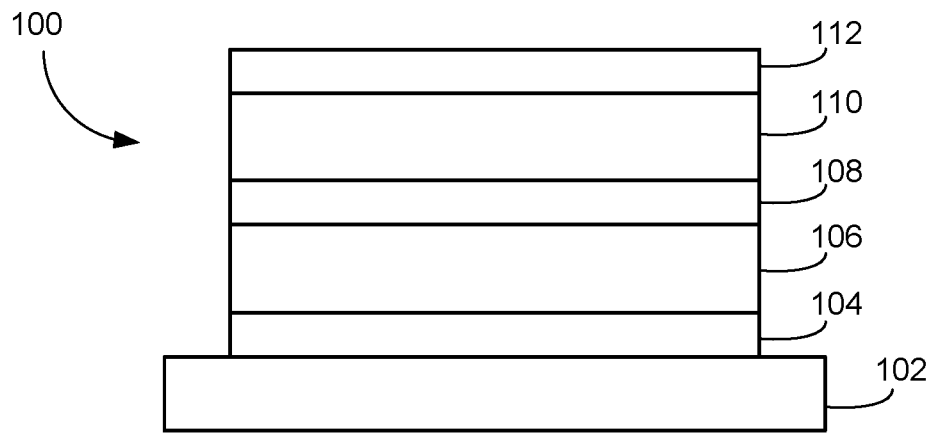
FIG. 1 is a schematic cross-sectional view of an exemplary light-emitting device in accordance with the present disclosure.

Referring now to the drawings in detail and initially to FIG. 1, an exemplary light-emitting device is indicated generally by reference numeral 100. As shown, a stack of layers is provided on a substrate 102. The layers are stacked on a major surface of the substrate in a direction orthogonal to the plane of the major surface. The layers include electrodes (anode and cathode 104, 112); charge transport layers (hole transport layer and electron transport layer 106, 110); and an emissive layer 108. In the exemplary embodiment shown, the charge transport layers 106, 110 are disposed between the electrodes 104, 112 and the emissive layer 108 is disposed between the charge transport layers 106, 110.

In some embodiments, such as the one shown, the stack is formed such that the anode is proximate the substrate. Accordingly, in the illustrated embodiment, the order of the layers moving away from the substrate 102 is an anode 104, hole transport layer 106, emissive layer 108, electron transport layer 110, and cathode 112. Although not specifically shown, in other embodiments, the layers may be stacked on the substrate in reverse order such that the cathode is proximate the substrate.

During operation, a bias may be applied between the anode 104 and cathode 112. The cathode 112 injects electrons into the electron transport layer 110 adjacent to it. Likewise, the anode 104 injects holes into the hole transport layer 106 adjacent to it. The electrons and holes respectively propagate though the hole transport layer 106 and the electron transport layer 110 to the emissive layer 108 where they radiatively recombine and light is emitted. In some embodiments, light may be emitted out of the substrate 102 side. In other embodiments, light may be emitted out of the cathode 112 side. In other embodiments, light may be emitted out of both the substrate 102 side and the cathode 112 side.

The substrate 102 may be made from any suitable material(s). Exemplary substrates include glass substrates and polymer substrates. More specific examples of substrate material(s) include polyimides, polyethenes, polyethylenes, polyesters, polycarbonates, polyethersulfones, polypropylenes, and/or polyether ether ketones. The substrate 102 may be any suitable shape and size. In some embodiments, the dimensions of the substrate 102 allow for more than one light-emitting device to be provided thereon. In an example, a major surface of the substrate 102 may provide an area for multiple light-emitting devices to be formed as sub-pixels of a pixel. In another example, a major surface of the substrate 102 may provide an area for multiple pixels (e.g., an array of pixels) to be formed thereon, each pixel including a sub-pixel arrangement of light-emitting devices.

The electrodes (anode and cathode 104, 112) may be formed from any suitable material(s). In some embodiments, at least one of the electrodes 104, 112 is a transparent or semi-transparent electrode. In some embodiments, at least one of the electrodes 104, 112 is a reflective electrode. In some embodiments, one of the electrodes 104, 112 is a transparent or semi-transparent electrode and the other electrode is a reflective electrode. Exemplary electrode materials include one or more metals (e.g., aluminum, gold, silver, platinum, magnesium, and the like and alloys thereof) or metal oxides (e.g., indium tin oxide, indium-doped zinc oxide (IZO), fluorine doped tin oxide (FTO), aluminum-doped zinc-oxide (AZO), indium-doped cadmium-oxide, and the like). The electrodes 104, 112 may also be provided in any suitable arrangement. As an example, the electrodes 102, 106 may address a thin-film transistor (TFT circuit).

The hole transport layer 106 may include one or more layers configured to transport holes therethrough from the anode 104 to the emissive layer 108. The hole transport layer 106 may be made from any suitable material(s). In some embodiments, the hole transport layer 106 may include one or more of poly(3,4-ethylenedioxythiophene):poly(styrene-sulfonate) (PEDOT:PSS), poly(9,9-dioctylfluorene-co-N-(4-sec-butylphenyl)-diphenylamine) (TFB), poly(9-vinyl-carbazole) (PVK), poly(N,N'-bis(4-butylphenyl)-N,N'-bisphenylbenzidine) (poly-TPD), metal oxide materials (e.g., $V_2O_5$, NiO, CuO, $WO_3$, and/or $MoO_3$), and organic small molecule materials (e.g., 2,3,5,6-tetrafluoro-7,7,8,8-tetracyanoquinodimethane ($F_4$TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and/or N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC)). In embodiments where the hole transport layer 106 includes more than one layer, the material of one of the respective layers may differ from the material of one or more of the other layers. In other embodiments where the hole transport layer 106 includes more than one layer, the material of the respective layers may be the same.

The electron transport layer 110 may include one or more layers configured to transport electrons therethrough from the cathode 112 to the emissive layer 108. The electron transport layer 110 may be made from any suitable material(s). In some embodiments, the electron transport layer 110 may include one or more metal oxides (e.g., ZnO, $Mg_xZn_{1-x}O$ where $0 \le x \le 1$, $Al_xZn_{1-x}O$ where $0 \le x \le 1$, $TiO_2$, $ZrO_2$, and the like), organic small molecules (e.g., 2,2',2''-(1,3,5-benzinetriyl)-tris(1-phenyl-1-H-benzimidazole) (TPBi), N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), and the like), and thin ionic interlayers (e.g., 8-quinolinolato lithium (Liq.), LiF, $Cs_2CO_3$, and the like). In embodiments where the electron transport layer 110 includes more than one layer, the material of one of the respective layers may differ from the material of one or more of the other layers. In other embodiments where the electron transport layer 110 includes more than one layer, the material of the respective layers may be the same.

Figure 2:
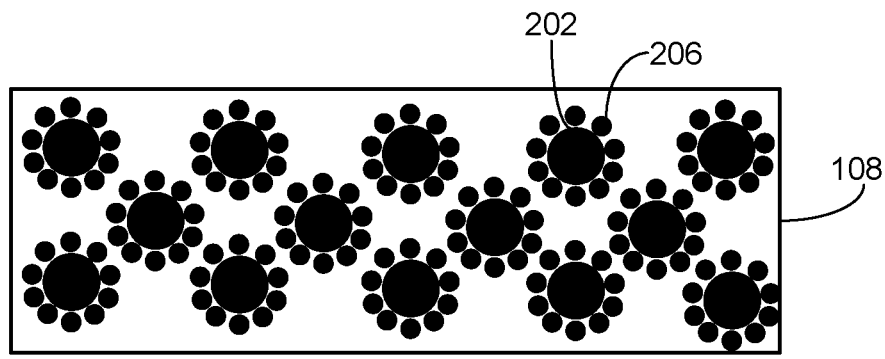
FIG. 2 is a schematic cross-sectional view of an exemplary emissive layer in accordance with the present disclosure.
Figure 3:
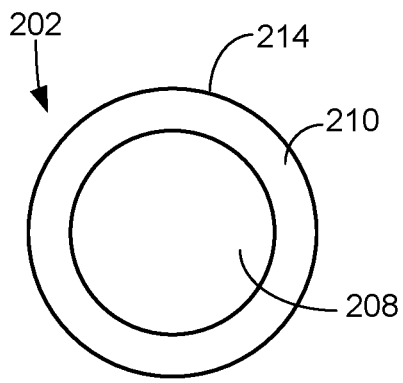
FIGS. 3 and 4 are schematic cross-sectional views of exemplary quantum dots in accordance with the present disclosure.
Figure 4:
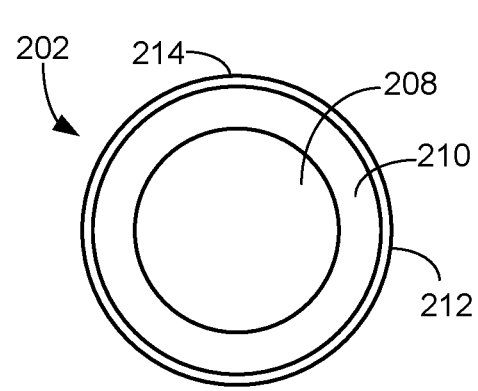

With additional reference to FIG. 2, the emissive layer 108 may include quantum dots (QDs) 202. Exemplary QD 202 materials (e.g., core and/or shell materials) include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnTe, ZnSeTe, InAs, ZnO, MgO, HgS perovskites of the form $ABX_3$, $Zn_wCu_zIn_{(w+z)}S$, and carbon, where $0 \le w, x, y, z \le 1$ and $(w+z) \le 1$. The QDs 202 may be embodied as nanoparticles. As an example, and with reference to FIG. 3, the QDs 202 may include a core 208 and a shell 210 around the core. Exemplary core-shell QDs include CdSe/CdS, CdSe/ZnS, InAs/CdSe, ZnO/MgO, CdS/HgS, CdS/CdSe, ZnSe/CdSe, MgO/ZnO, ZnTe/CdSe, CdTe/CdSe, CdS/ZnSe, and the like. In other embodiments, and with exemplary reference to FIG. 4, the QDs 202 may include a core 208, a shell 210 around the core, and an oxide layer 212 (e.g., an $Al_2O_3$ layer or a layer of another suitable metal oxide). In other exemplary embodiments (not specifically shown), the QD 202 may include only a core.

In some embodiments, the QDs 202 of the emissive layer 208 are of the same type. In other embodiments, the QDs 202 of the emissive layer 208 includes a mixture of two or more different types of QDs.

Compact ligands 206 are provided on the outer surface 214 of the QDs 202. For example, in the embodiment shown in FIG. 3 where the QD 202 includes a core 208 and shell 210, the compact ligands 206 are provided at the outer surface 214 of the QD, which is the outer surface of the shell. In another example, in the embodiment shown in FIG. 4 where the QD 202 includes a core 208, shell 210, and oxide layer 212, the compact ligands 206 are provided at the outer surface 214 of the QD, which is the outer surface of the oxide layer. In another example, where the QD 202 includes only a core, the compact ligands 206 are provided at the outer surface of the QD 202, which is the outer surface of the core.

The compact ligands 206 may include one or more short chain organic ligands, inorganic molecular ligands, or inorganic ions. Exemplary organic compact ligands include short chain (i.e., a chain of less than eight carbon atoms) organic ligands such as benzenethiol, 1,2-ethanedithiol (EDT), 3-mercaptopropionic acid (MPA), and the like. Exemplary inorganic molecular ligands include metal-organic complexes and the like. Exemplary inorganic ion ligands include halides (e.g., $I^-$, $Br^-$ and $Cl^-$), chalcogenides (e.g., $S^-$, $Se^-$, $Te^-$), thiocyanate ($SCN^-$), and the like.

At the outer surface 214 of a QD 202, the periodic crystal structure of the semiconducting material terminates, which results in localized defect states that may carry a charge. These defect states may act as charge traps, which increases the probability of non-radiative recombination. If the defects are not passivated, they may reduce the efficiency of light emission from the QD 202. The compact ligand 206 bound to a QD 202 may serve to passivate one or more defects in or on the outer surface of the QD 202. "Passivation" is a process which neutralizes the surface defect states by interactions with ligands. After passivation, the surface defect states may no longer act as trap states, and as a result the quantum yield may be increased as compared to the quantum yield of the QDs having the defect states.

The emissive layer 108 may include one or more layers configured to receive electrons injected by the cathode 106 and holes injected by the anode 104, whereupon the electrons and holes radiatively recombine and light is emitted. In such embodiments, the QDs of one of the respective layers of the emissive layers may differ from the QDs of one or more of the other layers. In other embodiments, the QDs of the respective layers of the emissive layer may be the same.

While FIG. 1 shows an exemplary light-emitting device including a hole transport layer 104 and an electron transport layer 110, it will be appreciated that in other embodiments (not specifically shown), one or both of these layers may be omitted from the light-emitting device. For example, for some embodiments of the light-emitting device, the order of the layers moving away from the substrate 102 may be an anode 104, emissive layer 108, electron transport layer 110, and cathode 112 (or these layers may be stacked on the substrate in reverse order such that the cathode is proximate the substrate). In another example, for some embodiments of the light-emitting device, the order of the layers moving away from the substrate 102 may be an anode 104, hole transport layer 106, emissive layer 108, and cathode 112 (or these layers may be stacked on the substrate in reverse order such that the cathode is proximate the substrate). In another example, for some embodiments of the light-emitting device, the order of the layers moving away from the substrate 102 may be an anode 104, emissive layer 108, and cathode 112 (or these layers may be stacked on the substrate in reverse order such that the cathode is proximate the substrate).

Furthermore, it will be appreciated that the light-emitting device (e.g., the device shown in FIG. 1 or the device in which one or both of the hole transport layer 104 and an electron transport layer 110 is omitted) may include one or more additional layers. Examples include a hole injection layer and/or an electron injection layer. Exemplary materials suitable for use in a hole injection layer include, but are not limited to, poly(3,4-ethylenedioxythiophene) polystyrene sulfonate (PEDOT:PSS), $MoO_3$:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylene-hexacarbonitrile (HATCN). Exemplary materials suitable for use in an electron injection layer include, but are not limited to, 8-quinolinolato lithium (Liq), LiF, $Cs_2CO_3$, and/or a polyelectrolyte such as Poly(ethylenimine) (PEI) or poly(ethylenimine) ethoxylated (PEIE).

Figure 5:
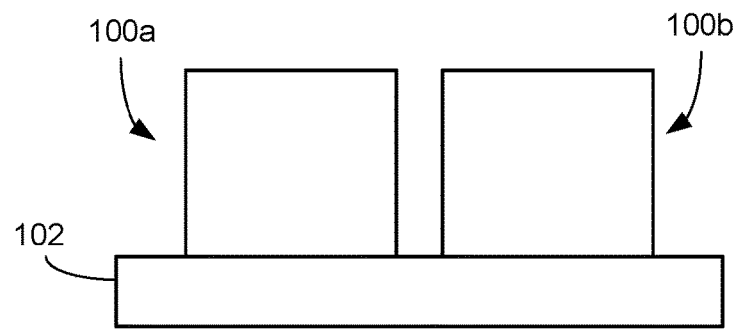
FIGS. 5 and 6 are schematic cross-sectional views of exemplary light-emitting devices in accordance with the present disclosure arranged in sub-pixel arrangements.
Figure 6:
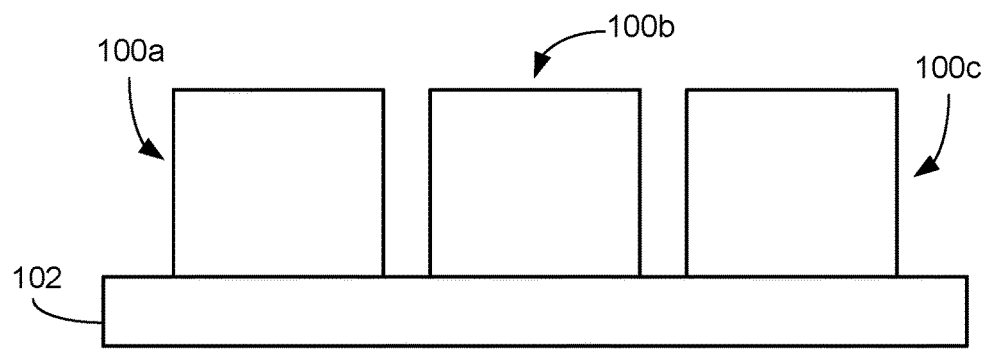

With additional exemplary reference to FIGS. 5 and 6, multiple instances of the light-emitting device may be provided in a sub-pixel arrangement (e.g., the sub-pixels collectively forming a pixel or a portion thereof). FIG. 5 shows an exemplary embodiment that includes light-emitting devices 100a, 100b arranged as two sub-pixels. The light-emitting devices 100a, 100b may include different respective emissive layers. For example, the light-emitting device that defines the first sub-pixel may include a first emissive layer including first QDs having a first emission wavelength, and the light-emitting device that defines the second sub-pixel may include a second emissive layer including second QDs having a second emission wavelength different than the first emission wavelength. FIG. 6 shows an exemplary embodiment that includes light-emitting devices 100a, 100b, 100c, arranged as three sub-pixels. The light-emitting devices 100a, 100b, 100c may include different respective emissive layers. For example, the light-emitting device that defines the first sub-pixel may include a first emissive layer including first QDs having a first emission wavelength, the light-emitting device that defines the second sub-pixel may include a second emissive layer including second QDs having a second emission wavelength different than the first emission wavelength, and the light-emitting device that defines the third sub-pixel may include a third emissive layer including second QDs having a third emission wavelength different than the first emission wavelength.

Turning now to FIGS. 7-21, an exemplary method of producing a plurality of light-emitting devices (e.g., in a sub-pixel arrangement) is described.

The production method may provide for the selective deposition of light-emitting devices having different respective emissive layers. The QDs of one of the light-emitting devices may differ from the QDs of the other of the light-emitting devices in one or more respects (e.g., composition, size, etc.) such that the emissive layers emit different respective colors. The production method may allow for fabrication of sub-pixel arrangements for high resolution displays. In the exemplary method described, a sub-pixel arrangement is produced that includes a first sub-pixel and a second sub-pixel (e.g., similar to that shown in FIG. 5). The first sub-pixel may include a first emissive layer including first QDs having a first emission wavelength. The second sub-pixel includes a second emissive layer including second QDs having a second emission wavelength. It will be appreciated that the exemplary method may be utilized in producing sub-pixel arrangements of more than two light-emitting devices (e.g., three, four, etc.) As such, the produced sub-pixel may include a more than two sub-pixels (e.g., as exemplified in FIG. 6).

Figure 7:
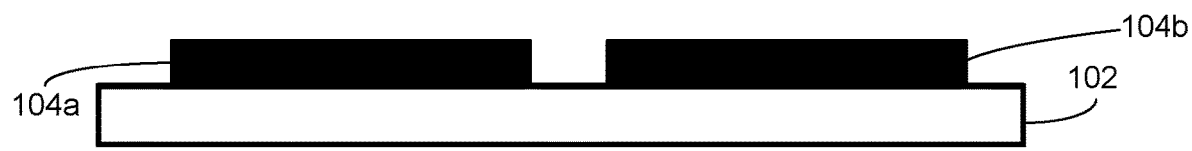
FIG. 7-11 are schematic cross-sectional views showing production of parts of an exemplary light-emitting device produced in accordance with an exemplary method of the present disclosure.

As shown in FIG. 7, a first anode 104a and a second anode 104b are respectively deposited on the substrate 102. In this exemplary embodiment in which the production method is for fabrication of light-emitting devices in a sub-pixel arrangement, the first anode 104a may be the electrode for a first light-emitting device (first sub-pixel) 100a, and the second anode 104b may be the electrode for a second light-emitting device (second sub-pixel) 100b. The first and second anodes 104a, 104b may be deposited on the substrate 102 using any suitable method. Exemplary methods include sputtering, evaporative coating, printing, chemical vapor deposition, and the like. As described above, the deposited electrode may be provided in any suitable form. One exemplary implementation is an electrode for a TFT circuit.

Figure 8:
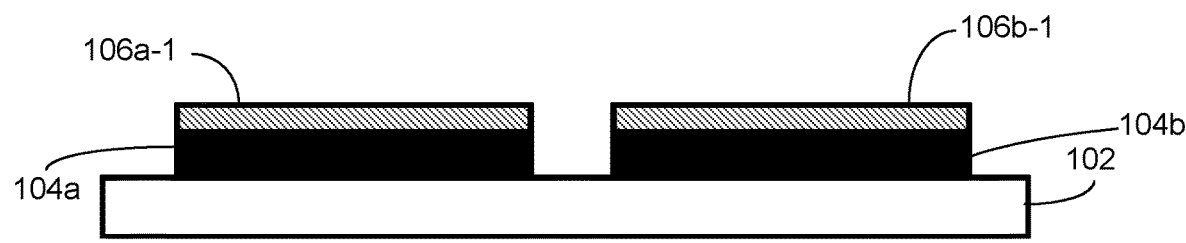
Figure 9:
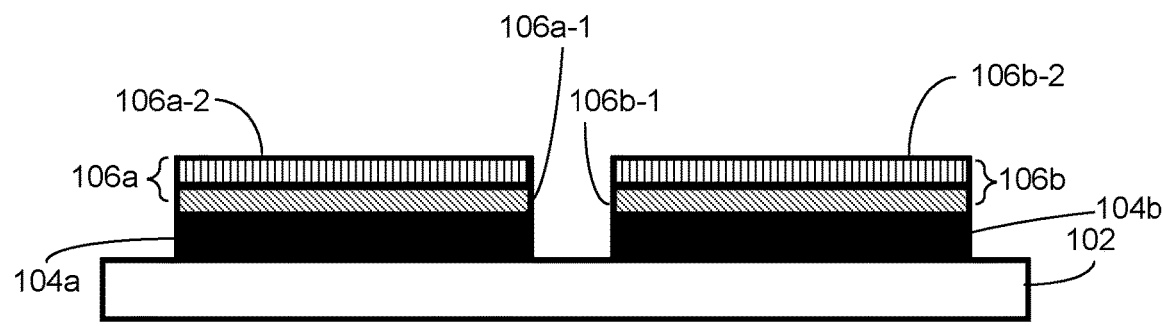

In the exemplary production method, the hole transport layers 106a, 106b of the light emitting devices each include more than one layer. As shown in FIGS. 8 and 9, the multiple layers of the hole transport layer are deposited. More specifically, as shown in FIG. 8, a first layer 106a-1 of the first hole transport layer 106a is deposited on the first anode 104a and a first layer 106b-1 of the second hole transport layer 106b is deposited on the second anode 104b. Furthermore, as shown in FIG. 9, a second layer 106a-2 of the first hole transport layer 106a is deposited on the first layer of the first hole transport layer 106b and a second layer 106b-2 of the second hole transport layer 106b is deposited on the first layer of the second hole transport layer 106b. In some embodiments, the first and second layers of the respective first hole transport layer 106b and second hole transport layer 106b may be formed by a patterning process (e.g., UV lithographic patterning). In some embodiments, the material and/or thicknesses of the first layer of the first and second hole transport layers and the second layer of the first and second hole transport layers may be the same or may differ from one another. In other embodiments, the material and/or thicknesses of the first layer of the first and second hole transport layers and the second layer of the first and second hole transport layers may differ from one another.

Figure 10:
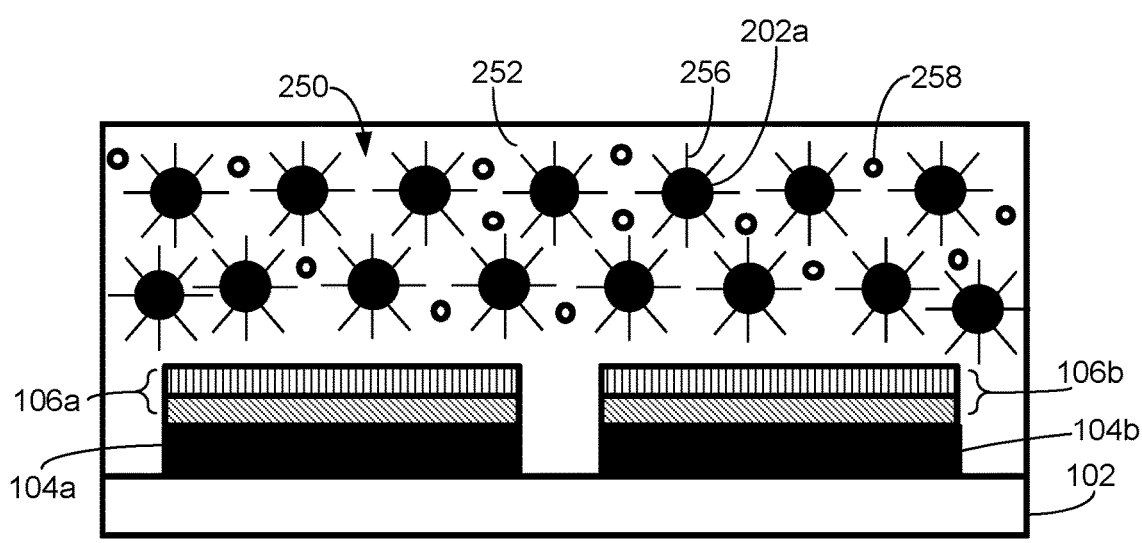

As shown in FIG. 10, a first solution 250 (e.g., also referred to as a quantum dot solution) is disposed on top of the structure (e.g., on top of the substrate 102; the stack of the first hole transport layer 106b and the first anode 104a; and the stack of the second hole transport layer 106b and the second anode 104b). As such, the first solution is contacted with the uppermost formed layer of the first light-emitting device and the uppermost formed layer of the second light-emitting device. The first solution 250 includes a solvent 252 in which cross-linkable QDs 202a are dispersed. In some embodiments, the cross-linkable QDs 202a include organic, cross-linkable, exchangeable ligands 256 bound to the outer surface thereof. In some embodiments, the first solution 250 also includes photo-initiator 258. A photo-initiator 258 is a material that initiates polymerization by a light stimuli.

The solvent 252 of the first solution 250 may be any suitable solvent. In some embodiments, the solvent 252 is selected such that the QDs (and photo-initiator 258, if included) are soluble therein. Exemplary solvents include, but are not limited to the following or mixtures including the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3, 5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene). The particular solvent that is utilized may depend on the QDs, ligands, and photo-initiator that are selected.

Similar to the QDs described above in connection with the emissive layer, exemplary QD 202a materials (e.g., core and/or shell materials) include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnTe, ZnSeTe, InAs, ZnO, MgO, HgS perovskites of the form $ABX_3$, $Zn_wCu_zIn_{1-(w+z)}S$, and carbon, where $0 \leq w, x, y, z \leq 1$ and $(w+z) \leq 1$. The QDs 202a may be embodied as nanoparticles. As an example, and with reference to FIG. 3, the QDs may include a core 208 and a shell 210 around the core. Exemplary core-shell QDs include CdSe/CdS, CdSe/ZnS, InAs/CdSe, ZnO/MgO, CdS/HgS, CdS/CdSe, ZnSe/CdSe, MgO/ZnO, ZnTe/CdSe, CdTe/CdSe, CdS/ZnSe, and the like. In other embodiments, and with exemplary reference to FIG. 4, the QDs may include a core 208, a shell 210 around the core, and an oxide layer 212 (e.g., an $Al_2O_3$ layer or a layer of another suitable metal oxide). In other exemplary embodiments (not specifically shown), the QDs may include only a core.

The organic, cross-linkable, exchangeable ligands 256 may include at least two moieties with different characteristics. As an example, one of the least two moieties of the molecule may provide UV-crosslinking capabilities and another of the at least two moieties of the molecule provide exchangeable binding capabilities. In some embodiments, the cross-linkable moiety includes an oxetan group and/or a vinylbenzyl group. In some embodiments, the exchangeable binding moiety includes a carboxylic acid group and/or a thiol group One example of an organic, cross-linkable, exchangeable ligand is 8-((3-ethyloxetan-3-yl)methoxy)octanoic acid, shown below in Formula 1. This example ligand contains an ethyloxetan group (e.g., cross-linkable moiety) and, at the other end of the molecule, a carboxylic acid group (e.g., exchangeable binding moiety).

Formula 1

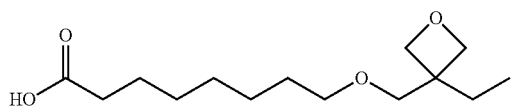

Another example of an organic, cross-linkable, exchangeable ligand is 8-((4-vinylbenzyl)oxy)octanoic, shown below in Formula 2. This example ligand contains a cross-linkable vinylbenzyl group (e.g., cross-linkable moiety) and a carboxylic acid group (e.g., exchangeable binding moiety).

Formula 2

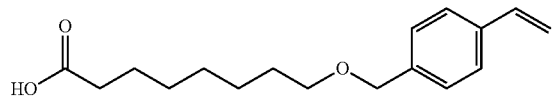

Another example of an organic, cross-linkable, exchangeable ligand is 8-((3-ethyloxetan-3-yl)methoxy)octane-1-thiol, shown below in Formula 3. This example ligand contains an ethyloxetan group (e.g., cross-linkable moiety) and a thiol group (e.g., exchangeable binding moiety).

Formula 3

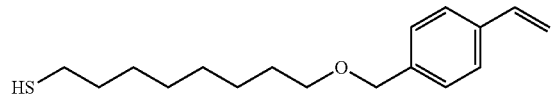

Another example of an organic, cross-linkable, exchangeable ligand is 8-((4-vinylbenzyl)oxy)octane-1-thiol, shown below in Formula 4. This example ligand contains a vinylbenzyl group (e.g., cross-linkable moiety) and a thiol group (e.g., exchangeable binding moiety).

Formula 4

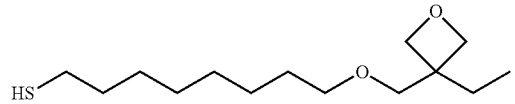

The QDs may be provided in any suitable concentration in the first solution 250. In some embodiments, the concentration of the QDs in the first solution 250 is in the range of 5 mg/mL to 150 mg/mL of the first solution. In other embodiments, the concentration of the QDs in the first solution 250 is in the range of 10 mg/mL to 100 mg/mL of the first solution. In other embodiments, the concentration of the QDs in the first solution 250 is in the range of 15 mg/mL to 75 mg/mL of the first solution.

Exemplary photo-initiators 258 include, but are not limited to, cationic species and/or radicals, Brönsted acids, carbenium ions, and/or onium ions by light irradiation. Exemplary photo-initiators 258 include sulfonium- and iodonium-salts (e.g., triphenylsulfonium triflate and diphenyliodonium triflate). In some embodiments, the photo-initiator 258 may generate one or more radicals, ions, acids, and/or species that may initiate such polymerizations.

Figure 13:
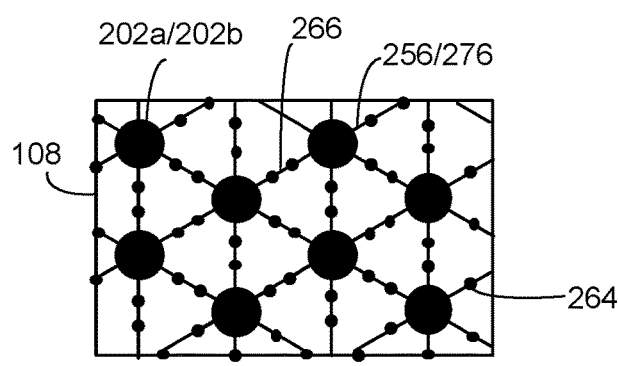

In some embodiments, photo-initiator is present in the first solution 250 in an amount falling in the range of 0.5 wt % to 15 wt % of the first solution 250. In other embodiments, photo-initiator is present in the first solution 250 in an amount falling in the range of 1 wt % to 10 wt % of the first solution 250. In some embodiments, the first solution may include one or more charge transport materials. As described below, the one or more charge transport materials may be UV-induced crosslinked charge transport materials and may interact with the ligands 256 (FIG. 13). Exemplary UV-induced crosslinked charge transport materials 202 include UV-induced crosslinked hole transport materials and/or UV-induced crosslinked electron transport materials. Such materials include one or more hole transport materials and/or one or more electron transport materials.

Figure 11:
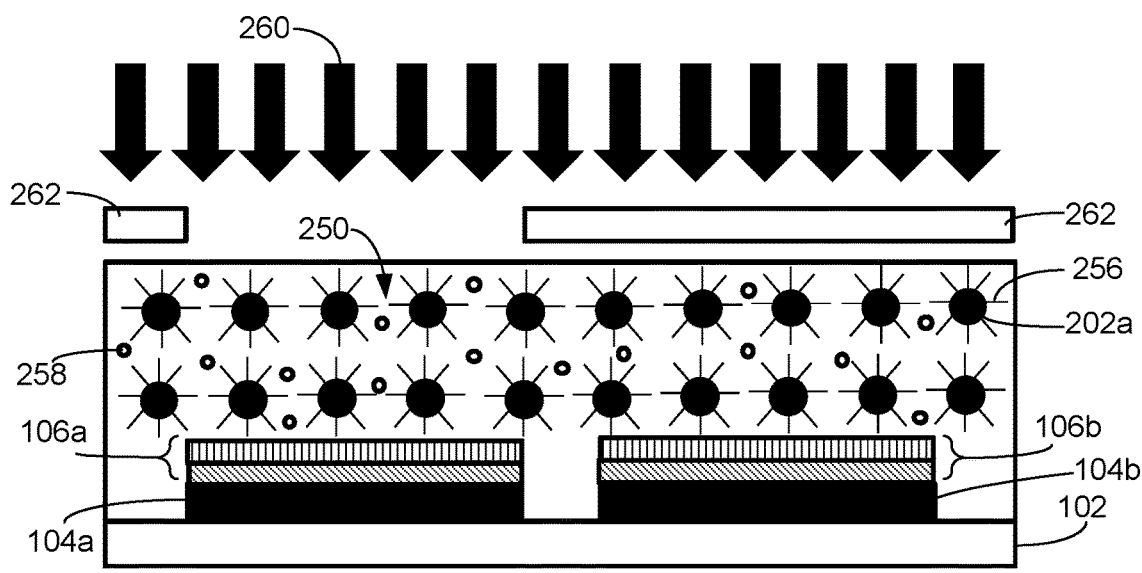

As shown in FIG. 11, UV light 260 is applied through a first mask 262 that provides a shape/pattern through which the desired area of the first solution 250 is exposed. As shown, the first mask 262 is configured such that UV light is incident on a region coinciding with the region of the first stack (first sub-pixel). In some embodiments, and with additional reference to FIG. 12, exposure of the first solution 250 to UV light results in cross-links forming between the organic, cross-linkable, exchangeable ligands 256 that are bound to the respective QDs. The QDs are part of the crosslinked matrix formed by the ligands 256. The ligands 256 are joined at respective ligand-ligand bond locations 264 to form the matrix, rendering the matrix insoluble (e.g., an "insoluble matrix"). In this crosslinked state, the emissive layer 108 may also be referred to as being in an intermediary state before the ligand exchange takes place. In the intermediary state, the QDs 202 have organic, exchangeable, crosslinked ligands 256.

In other embodiments in which the one or more charge transport materials are included in the first solution 250, exposure of the first solution 250 to UV light results in cross-links formed between the ligands 256 and a "bridging" molecule 266 from the one or more charge transport materials that can then subsequently link to another ligand 256 on a different QD. This bridging molecule 266 may include charge transport moieties. In such embodiments, and with additional reference to FIG. 13, the crosslinked bridging molecule 266 may form the conductive insoluble matrix together with the QDs and ligands 256. As shown, the ligands are joined at respective bond locations 264 to the charge transport material 202. In this crosslinked state, the emissive layer 108 may also be referred to as being in an intermediary state before the ligand exchange takes place. In the intermediary state, the QDs 202 have organic, exchangeable, crosslinked ligands 256.

The term "insoluble," as used herein in connection with "insoluble matrix," is indicative of the matrix being insoluble in the solvent in which the QDs are initially dispersed during the formation of the emissive layer, or in a solvent having similar properties to those used to disperse the QDs. Such similar solvents may have one or more similar properties such as polarity (dielectric constant), protic-aprotic property, and the like. The similar solvent may be an "orthogonal solvent" in that it does not dissolve the matrix deposited from the other solvent. As such, the insoluble matrix may be insoluble in orthogonal solvents.

In embodiments where the first solution 250 includes photo-initiator 258, the photo-initiator 258 may assist in initializing the crosslinking of the organic, cross-linkable, exchangeable ligands 256 (and/or the one or more charge transport materials, if included in the first solution 250).

Factors such as the UV exposure times, UV-intensity, amount of photo-initiator, and ratio between UV-reactive moieties may allow for control of the morphology of the emissive material. For example, UV exposure time may in some embodiments range from 0.1 second to 15 minutes. UV exposure intensity may range from 0.1 to 100,000 mJ/cm$^2$. The amount of photo-initiator may range from 0.001 to 10 wt % of the solution. In one exemplary implementation, the UV exposure intensity ranges from 1 to 100 mJ/cm$^2$ at a UV exposure time of 1 to 10 seconds.

Figure 14:
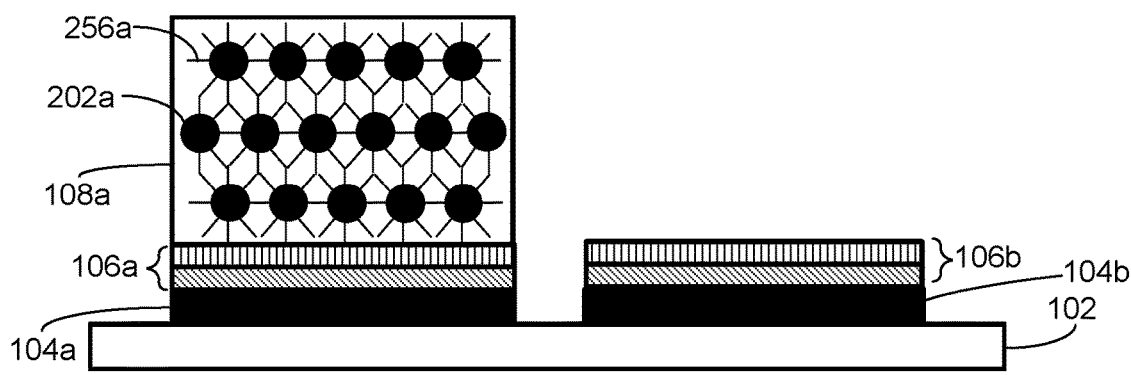
FIG. 14-21 are schematic cross-sectional views showing production of parts of an exemplary light-emitting device produced in accordance with an exemplary method of the present disclosure.

The remaining first solution 250 may be washed away with a solvent. In some embodiments, said solvent is the same type of solvent 252 that is utilized in the first solution 250 in the step shown in FIG. 11. In other embodiments, the solvent is a similar solvent or orthogonal solvent to the solvent 252 used in the first solution 250. Accordingly, as shown in FIG. 14, the crosslinked first emissive layer 108a remains in the region of the first sub-pixel. As shown the QDs 202a are dispersed in the emissive layer 108a.

In some embodiments, the solvent used to wash away the remaining solution may be evaporated by curing (e.g., heating of the deposited layer). The curing may be performed at any suitable temperature that effectuates evaporation of the solvent while also maintaining the integrity of the QDs. In some examples, curing may be performed at a temperature ranging from 5° C. to 150° C. In other examples, curing may be performed at a temperature ranging from 30° C. to 150° C. In other examples, curing may be performed at a temperature ranging from 30° C. to 100° C. In other embodiments, there is no curing following washing and prior to application of the second solution 270.

Figure 15:
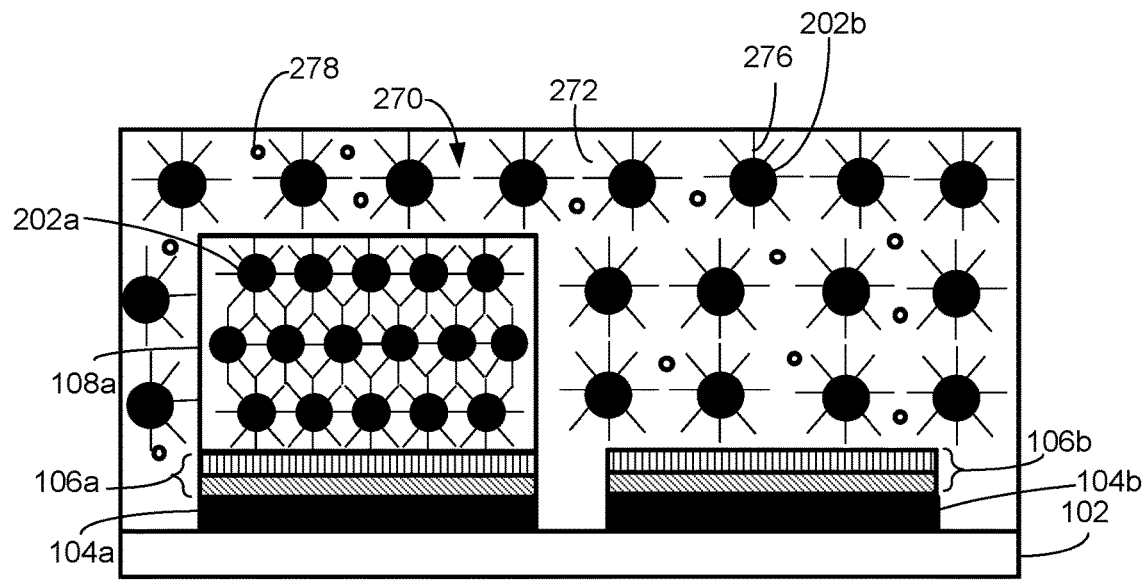

Turning now to FIG. 15, a second solution 270 (e.g., also referred to as a quantum dot solution) is disposed on top of the structure (e.g., on top of the substrate 102; the stack of the second hole transport layer 106b and the second anode 104b; and at least a portion of the stack of the first emissive layer 108a, first hole transport layer 106b and the first anode 104a). As such, the second solution is in contact with the uppermost formed layer of the second light-emitting device and one or more of the formed layers of the first light-emitting device While the second solution 270 is shown as being provided over the first emissive layer 108a, it will be appreciated that the second solution 270 may be provided at a level such that the second solution does not cover the first emissive layer 108. The second solution 270 includes a solvent 272 in which cross-linkable QDs 202 are dispersed. In some embodiments, the cross-linkable QDs include organic, cross-linkable, exchangeable ligands 276 bound to the outer surface thereof. In some embodiments, the second solution 270 also includes photo-initiator 278.

The solvent 272 of the second solution 270 may be any suitable solvent. In some embodiments, the solvent 272 is selected such that the QDs 202b (and photo-initiator 278, if included) are soluble therein. Exemplary solvents include, but are not limited to the following or mixtures including the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3, 5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene). The particular solvent that is utilized may depend on the QDs, ligands, and photo-initiator that are selected. In some embodiments, the solvent 272 of the second solution 270 is the same type of solvent as the solvent 252 used in the first solution 250. In other embodiments, the solvent 272 is a different solvent than the solvent 252 used in the first solution 250.

Similar to the QDs described above in connection with the emissive layer, exemplary QD 202b materials (e.g., core and/or shell materials) include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnTe, ZnSeTe, InAs, ZnO, MgO, HgS perovskites of the form $ABX_3$, $Zn_wCu_zIn_{1-(w+z)}S$, and carbon, where $0 \leq w, x, y, z \leq 1$ and $(w+z) \leq 1$. The QDs 202b may be embodied as nanoparticles. As an example, and with reference to FIG. 3, the QDs may include a core 208 and a shell 210 around the core. Exemplary core-shell QDs include CdSe/CdS, CdSe/ZnS, InAs/CdSe, ZnO/MgO, CdS/HgS, CdS/CdSe, ZnSe/CdSe, MgO/ZnO, ZnTe/CdSe, CdTe/CdSe, CdS/ZnSe, and the like. In other embodiments, and with exemplary reference to FIG. 4, the QDs may include a core 208, a shell 210 around the core, and an oxide layer 212 (e.g., an $Al_2O_3$ layer or a layer of another suitable metal oxide). In other exemplary embodiments (not specifically shown), the QD may include only a core.

In some embodiments, the QDs 202b are different in one or more respects from the QDs 202a utilized in the production of the emissive layer 108a. For example, the size and/or composition of the QDs 202b may differ from the size and/or composition of the QDs 202a. The first quantum dots may have a different emission wavelength than the second quantum dots.

The organic, cross-linkable, exchangeable ligands 276 of the QDs may include at least two moieties with different characteristics. As an example, one of the least two moieties of the molecule may provide UV-crosslinking capabilities and another of the at least two moieties of the molecule provide exchangeable binding capabilities. Exemplary organic, cross-linkable, exchangeable ligands are shown above in Formulas 1-4. In some embodiments, the organic, cross-linkable, exchangeable ligands 276 may be the same as the organic, cross-linkable, exchangeable ligands 256 of the QDs included in the first QD solution 250. In other embodiments, the organic, cross-linkable, exchangeable ligands 276 may be different than the organic, cross-linkable, exchangeable ligands 256 of the QDs included in the first QD solution 250.

The QDs may be provided in any suitable concentration in the second solution 270. In some embodiments, the concentration of the QDs in the second solution 270 is in the range of 5 mg/mL to 150 mg/mL of the second solution. In other embodiments, the concentration of the QDs in the second solution 270 is in the range of 10 mg/mL to 100 mg/mL of the second solution. In other embodiments, the concentration of the QDs in the second solution 270 is in the range of 15 mg/mL to 75 mg/mL of the second solution.

Exemplary photo-initiators 278 include, but are not limited to, cationic species and/or radicals, Brönsted acids, carbenium ions, and/or onium ions by light irradiation. Exemplary photo-initiators 278 include sulfonium- and iodonium-salts (e.g., triphenylsulfonium triflate and diphenyliodonium triflate). In some embodiments, the photo-initiator 278 may generate one or more radicals, ions, acids, and/or species that may initiate such polymerizations.

In some embodiments, photo-initiator is present in the second solution 270 in an amount falling in the range of 0.5 wt % to 15 wt % of the second solution 270. In other embodiments, photo-initiator is present in the second solution 270 in an amount falling in the range of 1 wt % to 10 wt % of the second solution 270.

In some embodiments, the first solution may include one or more charge transport materials 286. As described below, the one or more charge transport materials may be UV-induced crosslinked charge transport materials and may interact with the ligands 256 (FIG. 13). Exemplary UV-induced crosslinked charge transport materials 202 include UV-induced crosslinked hole transport materials and/or UV-induced crosslinked electron transport materials. Such materials include one or more hole transport materials and/or one or more electron transport materials. In some embodiments, the cross-linkable hole transport material may be a material which is an effective hole transporter both without and with crosslinking. In other embodiments, the cross-linkable hole transport material may be a material which is an effective hole transporter only when crosslinked. In some embodiments, the cross-linkable electron transport material may be a material which is an effective electron transporter both without and with crosslinking. In other embodiments, the cross-linkable electron transport material may be a material which is an effective electron transporter only when crosslinked. In some embodiments, the crosslinked charge transport materials 202 can include one or more of hole injection materials, electron injection materials, hole blocking materials, electron blocking materials, and/or interconnecting materials (ICM).

Figure 12:
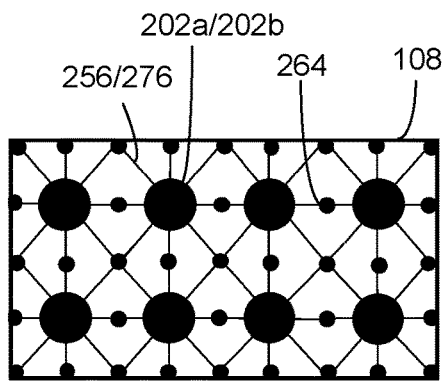
FIGS. 12 and 13 are schematic cross-sectional views of exemplary emissive layers produced in accordance with the exemplary method described in FIGS. 7-11.
Figure 16:
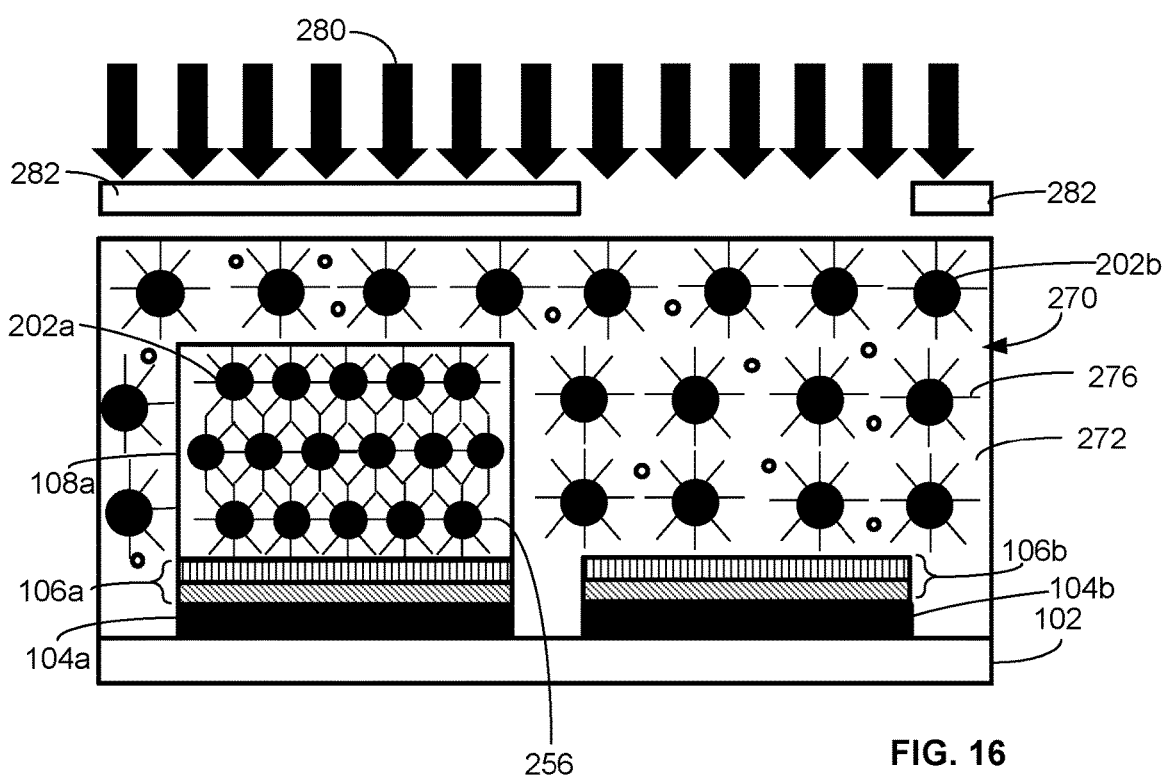

As shown in FIG. 16, UV light 280 is applied through a first mask 282 that provides a shape/pattern through which the desired area of the second solution 270 is exposed. As shown, the first mask 282 is configured such that UV light is incident on a region coinciding with the region of the second stack (second sub-pixel). In some embodiments, exposure of the second solution 270 to UV light results in cross-links forming between the organic, cross-linkable, exchangeable ligands 276 that are bound to the respective QDs 202b (e.g., as shown in FIG. 12). The QDs are part of the crosslinked matrix formed by the ligands 276. The ligands 276 are joined at respective ligand-ligand bond locations 264 to form the matrix, rendering the matrix insoluble (e.g., an "insoluble matrix"). In this crosslinked state, the emissive layer 108b may also be referred to as being in an intermediary state before the ligand exchange takes place. In the intermediary state, the QDs 202b have organic, exchangeable, crosslinked ligands 276.

In other embodiments, exposure of the second solution 270 to UV light results in cross-links formed between the ligands 276 and a "bridging" molecule that can then subsequently link to another ligand 276 on a different QD 202b. This bridging molecule may include charge transport moieties. In such embodiments, and with additional reference to FIG. 13, the crosslinked charge transport material 202 may form the conductive insoluble matrix together with the QDs 202b. As shown, the charge transport materials are joined at respective bond locations 264 to form the matrix, and the QDs 204 are also joined at respective bond locations 264 to the charge transport material 286. As such, the QDs 202b form a part of the matrix network. In some embodiments, the one or more charge transport materials 286 may be UV-induced crosslinked charge transport materials. In this crosslinked state, the emissive layer 108b may also be referred to as being in an intermediary state before the ligand exchange takes place. In the intermediary state, the QDs 202b have organic, exchangeable, crosslinked ligands 276.

In embodiments where the second solution 270 includes photo-initiator 278, the photo-initiator 278 may assist in initializing the crosslinking of the organic, cross-linkable, exchangeable ligands 276 (and/or the one or more charge transport materials, if included in the first solution 270).

Factors such as the UV exposure times, UV-intensity, amount of photo-initiator, and ratio between UV-reactive moieties may allow for control of the morphology of the emissive material. For example, UV exposure time may in some embodiments range from 0.1 second to 15 minutes. UV exposure intensity may range from 0.1 to 100,000 $mJ/cm^2$. The amount of photo-initiator may range from 0.001 to 10 wt % of the solution. In one exemplary implementation, the UV exposure intensity ranges from 1 to 100 $mJ/cm^2$ at a UV exposure time of 1 to 10 seconds.

Figure 17:
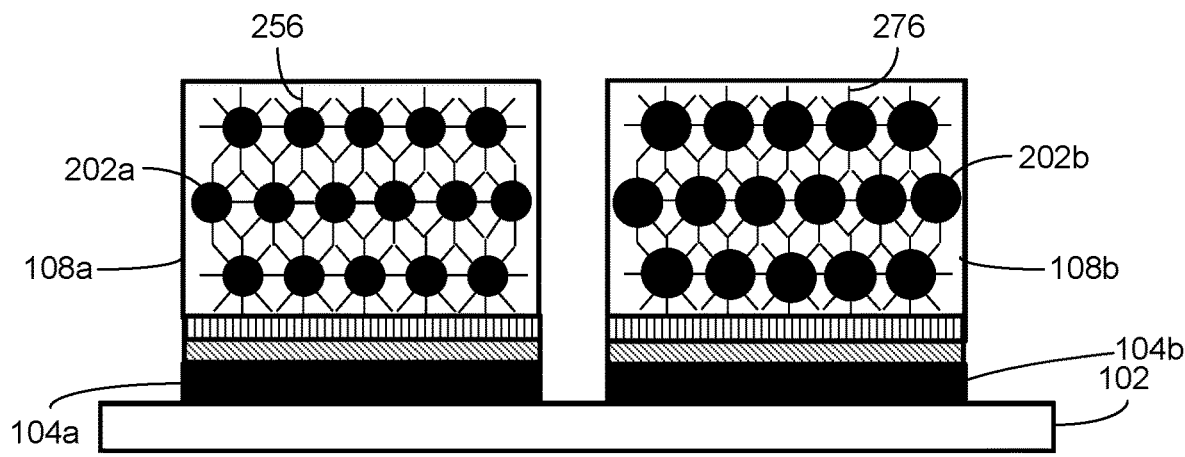

The remaining second solution 270 may be washed away with a solvent. In some embodiments, said solvent is the same type as the solvent 272 used in the second solution 270 in the step shown in FIG. 15. In other embodiments, the solvent is a similar solvent or orthogonal solvent to the solvent 272 used in the second solution 270. Accordingly, as shown in FIG. 17, the crosslinked second emissive layer 108b remains in the region of the second sub-pixel. As shown, the QDs 202b are dispersed in the insoluble emissive layer 108b. FIG. 17 shows the resultant two patterned areas containing first and second emissive layers 108a, 108b, each including QDs 202a, 202b and ligands 256, 276, respectively.

In some embodiments, the solvent used to wash away the remaining solution may be evaporated by curing (e.g., heating of the deposited layer). The curing may be performed at any suitable temperature that effectuates evaporation of the solvent while also maintaining the integrity of the QDs. In some examples, curing may be performed at a temperature ranging from 5° C. to 150° C. In other examples, curing may be performed at a temperature ranging from 30° C. to 150° C. In other examples, curing may be performed at a temperature ranging from 30° C. to 100° C. In other embodiments, there is no curing step following washing.

Figure 18:
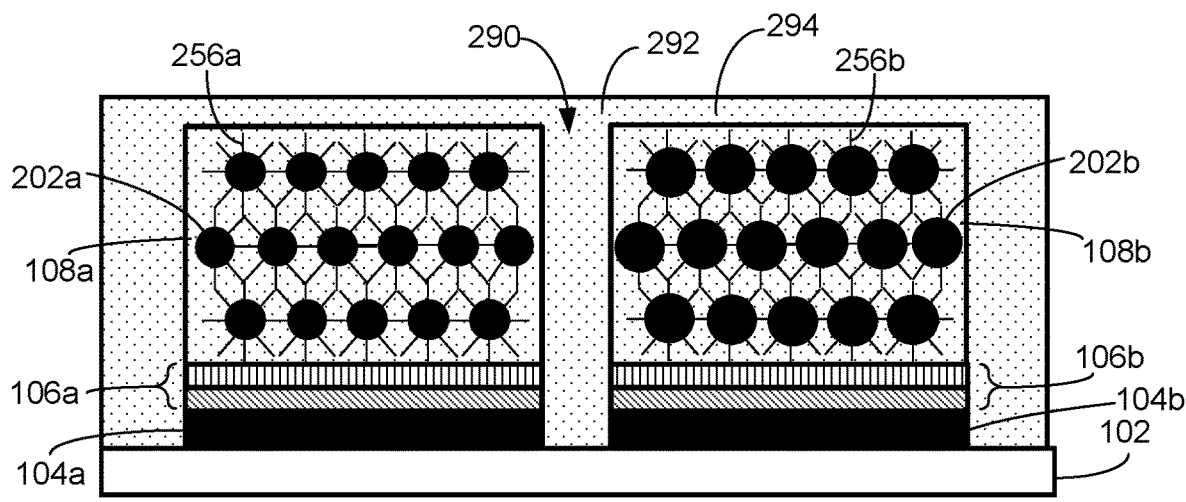

As shown in FIG. 18, a ligand exchange solution 290 is brought into contact with (e.g., disposed on) the first and second emissive layers 108a, 108b. The ligand exchange solution 290 includes a solvent 292 in which compact ligands 294 are dispersed.

The compact ligands 294 may include one or more short chain organic ligands, inorganic molecular ligands, or inorganic ions. Exemplary organic compact ligands include short chain (i.e., a chain of less than eight carbon atoms) organic ligands such as benzenethiol, 1,2-ethanedithiol (EDT), 3-mercaptopropionic acid (MPA), and the like. Exemplary inorganic molecular ligands include metal-organic complexes and the like. Exemplary inorganic ion ligands include halides (e.g., $I^-$, $Br^-$ and $Cl^-$), chalcogenides (e.g., $S^-$, $Se^-$, $Te^-$), thiocyanate ($SCN^-$), and the like. In those implementations where the compact ligands 294 are inorganic ion ligands, the ligand exchange solution 290 may be a salt solution. The solvent used for the salt solution may be any suitable solvent that will dissolve the ionic salt. Exemplary solvents include, but are not limited to, polar solvents such as methanol, ethanol, dimethylformamide, water, and the like. The salt used in the salt solution may include halide anions (e.g., $F^-$, $Cl^-$, $Br^-$, $I^-$) and either organic cations (e.g., tetra aryl ammonium, phosphonium, arsonium, antimonium) or inorganic cations (e.g., alkali, alkaline earth, transition metals). The organic tetra aryl cations may include different organic moieties such as: four equal aryl groups R; three aryl groups R and one aryl group R'; two aryl groups R and two aryl groups R'; one aryl group R, one aryl group R', and two aryl groups R"; one aryl group R, one aryl group R'; one aryl group R" and one aryl group R'".

The solvent 292 of the ligand exchange solution 290 may be any suitable solvent. Exemplary solvents include, but are not limited to the following or mixtures including the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene). The particular solvent that is utilized may depend on the QDs, ligands, and compact ligands that are selected.

The compact ligands 294 may be provided in any suitable concentration in the ligand exchange solution 290. In some embodiments, the concentration of the compact ligands 294 in the ligand exchange solution 290 is in the range of 1 mg/mL to 150 mg/mL of the second solution. In other embodiments, the concentration of the compact ligands 294 in the ligand exchange solution 290 is in the range of 5 mg/mL to 75 mg/mL of the second solution. In other embodiments, the concentration of the compact ligands 294 in the ligand exchange solution 290 is in the range of 10 mg/mL to 50 mg/mL of the second solution.

When in contact with the ligand exchange solution, the organic, exchangeable, crosslinked ligands 256, 276 of the emissive layer 108a, 108b may be exchanged with the compact ligands 294. In some embodiments, the ligand exchange is a "solid-state ligand exchange (LE)." Solid-state LE refers to a process where a layer of QDs with an initial ligand is deposited and subsequently exposed to a solution containing a new ligand. The new ligand may then replace the initial ligand and be washed away with a solvent. Once deposited onto the QDs, the more reactive compact ligands replace the cross-linked ligands. Washing the layer with an orthogonal solvent should then remove the original cross linked ligands while keeping the QDs in place. Depending on the thickness of the layer of QDs and on the exposure time to the new ligand solution, the LE may occur just on the surface exposed to the new ligand solution or may involve more QDs. The solid-state LE process may be enabled by the exchangeable binding moiety of the original organic, cross-linkable, exchangeable ligands 256, 276.

In some embodiments, the ligand exchange solution 290 is left in contact with the emissive layers 108a, 108b for a time ranging from 5 s to 180 s to allow for ligand exchange to occur. In other embodiments, the ligand exchange solution 601 is left in contact with the emissive layers 108a, 108b for a time ranging from 30 s to 180 s to allow for ligand exchange to occur. In other embodiments, the ligand exchange solution 601 is left in contact with the emissive layers 108a, 108b for a time ranging from 30 s to 120 s to allow for ligand exchange to occur.

Factors such as the size of the compact ligands, the concentration of the ligand solution, and/or the time provided for exchanging the ligands may allow for control of the morphology of the emissive material.

In some embodiments, the exchangeable ligands in one or both of the emissive layers 108a, 108b are completely replaced by the compact ligands. In some embodiments, the exchangeable ligands in one or both of the emissive layers 108a, 108b are only partially replaced by the compact ligands. Accordingly, one or both of the emissive layers may include a mixture of compact ligands and additional ligands other than the compact ligands at the outer surface the quantum dots. For example, one or both of the emissive layers 108a, 108b may include a mixture of QDs having compact ligands and QDs having the exchangeable ligands. Furthermore, in some embodiments, after the exchange, some QDs may have a combination of compact ligands and exchangeable ligands at their outer surface. In some embodiments, following exchange, at least 50% of the ligands present in the emissive layer 108a, 108b are compact ligands. In other embodiments, following exchange, at least 70% of the ligands present in the emissive layer 108a, 108b are compact ligands. In other embodiments, following exchange, at least 85% of the ligands present in the emissive layer 108a, 108b are compact ligands. In other embodiments, following exchange, at least 95% of the ligands present in the emissive layer 108a, 108b are compact ligands.

Hence, in some embodiments, the emissive layer 108 for a single pixel 108 may contain both exchangeable cross-linked ligands and compact ligands. This may provide an unexpected benefit by utilizing the additional passivation of the compact ligand (leading to improved device efficiency) whilst keeping the structural integrity and morphology of the cross-linkable exchangeable ligands which can lead to improved charge transport and a reduction of defects such as pinholes.

Figure 19:
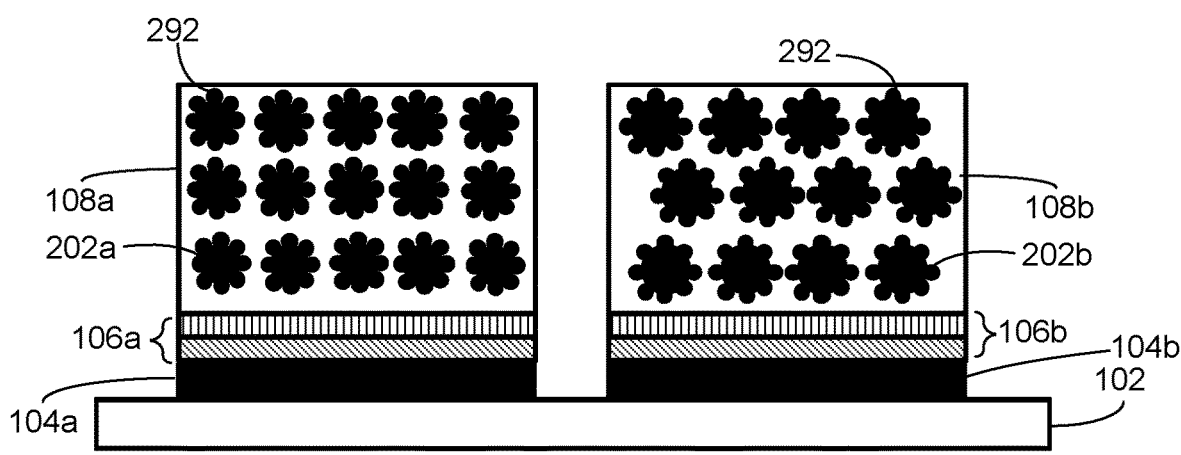

The remaining ligand exchange solution 290 may be washed away with a solvent. In some embodiments, said solvent is the same type as the solvent 292 used in the ligand exchange solution 290. In other embodiments, the solvent is a similar solvent or orthogonal solvent to the solvent 292 used in the ligand exchange solution 290. Accordingly, as shown in FIG. 19, the emissive layer 108a including the QDs 202a having compact ligands at their outer surface remains in the region of the first sub-pixel, and the emissive layer 108b including the QDs 202b having compact ligands at their outer surface remains in the region of the second sub-pixel.

In some embodiments, the solvent used to wash away the remaining solution may be evaporated by curing (e.g., heating of the deposited layer). The curing may be performed at any suitable temperature that effectuates evaporation of the solvent while also maintaining the integrity of the QDs. In some examples, curing may be performed at a temperature ranging from 5° C. to 150° C. In other examples, curing may be performed at a temperature ranging from 30° C. to 150° C. In other examples, curing may be performed at a temperature ranging from 30° C. to 100° C. In other embodiments, there is no curing step following washing.

Figure 20:
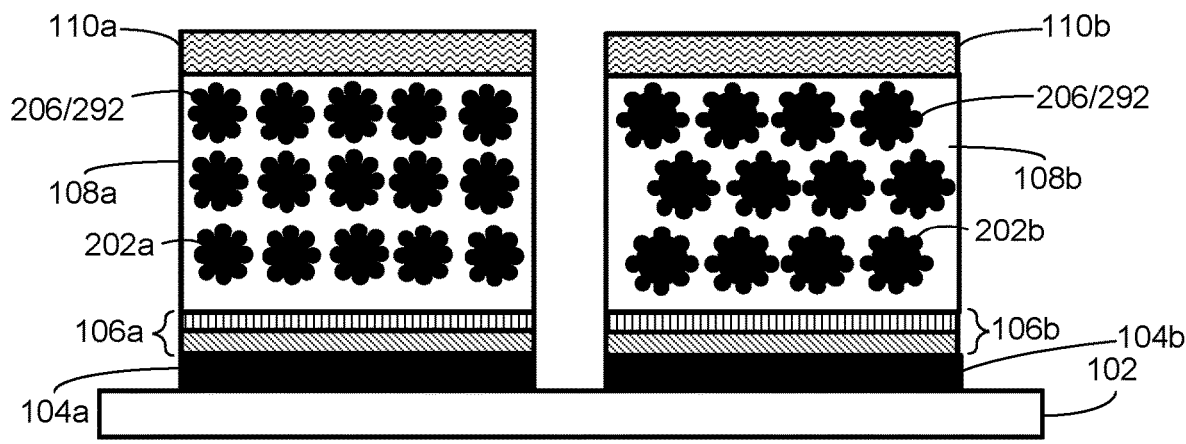

As shown in FIG. 20, a first electron transport layer 110b is deposited on the first emissive layer 108a and a second electron transport layer 110b is deposited on the second emissive layer 108b. In some embodiments, the first electron transport layer 110b and second electron transport layer 110b may be formed by a patterning process (e.g., UV lithographic patterning).

Figure 21:
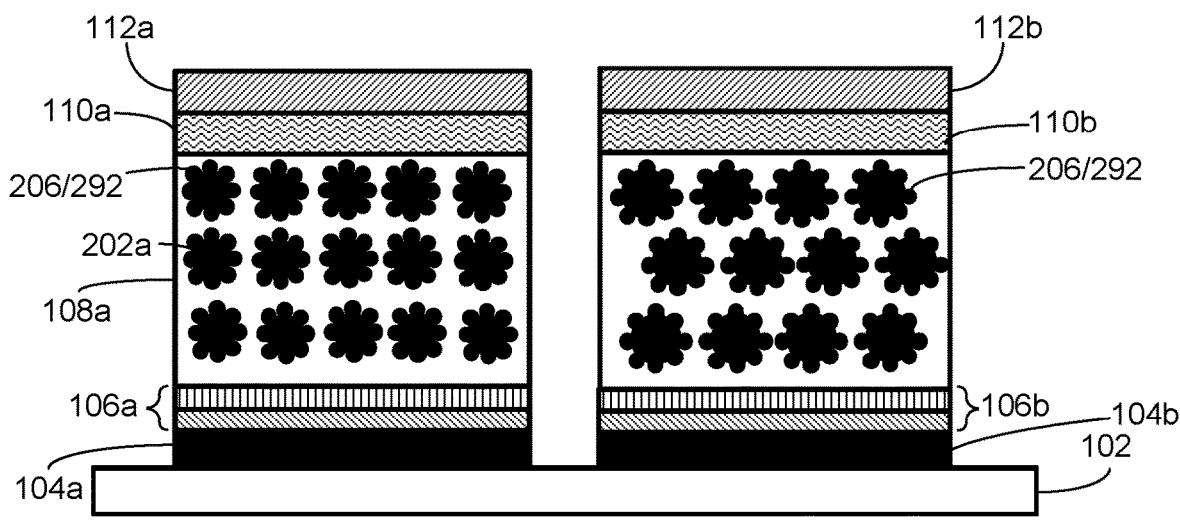

As shown in FIG. 21, a first electrode 112a is deposited on the first electron transport layer 110a and a second electrode 112b is deposited on the second electron transport layer 110b. The first and second electrodes 112a, 112b may be respectively deposited on the electron transport layers 110a, 110b using any suitable method. Exemplary methods include sputtering, evaporative coating, printing, chemical vapor deposition, and the like. As described above, the deposited electrode may be provided in any suitable form.

The above-described method produces an exemplary arrangement (e.g., sub-pixel arrangements) of two light-emitting devices, the two light-emitting devices having particular structures. It will be appreciated that in some embodiments, the method may be varied to produce a different arrangement of light-emitting devices and/or different configurations of the light-emitting devices.

As an example, while the order of the layers in the first and second light-emitting devices are shown above as being produced in an order in which the anode is closest to the substrate, the order of these layers may be reversed such that the cathode and electron transport layer are proximate the substrate. Also, it will be appreciated that the electron transport layer and/or the hole transport layer may be omitted or provided as one or multiple layers. Additional layers such as a hole injection layer and/or electron injection layer may also be provided.

As another example, while the emissive layers are shown as having the same thickness in a direction orthogonal to a major surface of the substrate on which the light-emitting devices are formed, in some embodiments the thickness of the first crosslinked layer in a direction orthogonal to a major surface of the substrate on which the light-emitting devices are formed is different than the thickness of the second crosslinked layer in the direction orthogonal to a major surface of the substrate on which the light-emitting devices are formed.

As another example, while the method shows the emissive layer of the light-emitting devices as a single layer, in other embodiments the production method may be conducted such that the emissive layer includes multiple layers. For example, the process as shown in FIGS. 10-18 may be repeated to provide a second layer of the emissive layer.

As another example, while the method shows the production of two light-emitting devices, in other embodiments the method may produce an arrangement of more than two (e.g., three, four, etc.) light-emitting devices. For example, the process may include additional steps similar to that shown in FIGS. 10-14 or FIGS. 15-17, wherein a solution including QDs is disposed on the device, a mask UV light are utilized to produce a crosslinked emissive layer on the additional device. Ligand exchange may subsequently be performed similar to that as shown in FIGS. 18 and 19, but including the additional devices and crosslinked emissive layers.

It should also be noted that while FIGS. 7-21 and the associated description set forth an exemplary method of producing a plurality of light-emitting devices (e.g., in a sub-pixel arrangement), in other embodiments, the method may be utilized for forming a single light-emitting device. For example, similar to that which is shown and described in connection with FIGS. 7-9, one or more layers of the light-emitting device may be formed on a substrate (e.g., only one of the stacks is formed such as layers 104a, and 106a). Similar to that which is shown and described in connection with FIG. 10, a solution (quantum dot solution) including quantum dots having ligands at the outer surface thereof dispersed in a solvent is contacted with the uppermost formed layer of the light-emitting device (e.g., the uppermost formed layer 106a). Similar to that which is shown and described in connection with FIGS. 11-13, a portion of the solution is subjected to external activation stimuli to form a crosslinked layer (e.g., 108a) on the uppermost formed layer of the light-emitting device, the crosslinked layer including a crosslinked matrix including the quantum dots and the ligands at the outer surface of the quantum dots in a crosslinked state. Similar to that which is shown and described in connection with FIG. 14, the portion of the solution not forming the crosslinked layer (e.g., 108a) may be washed away. Similar to that which is shown and described in connection with FIGS. 18 and 19, the cross-linked layer (e.g., 108a) may be contacted with a ligand exchange solution (e.g., 290) including compact ligands (e.g., 292) to perform a ligand exchange to exchange at least a portion of the crosslinked ligands with the compact ligands. Similar to that which is shown and described in connection with FIGS. 20 and 21, an electron transport layer (e.g., 110b) may be deposited on the emissive layer (e.g., 108a) and an electrode (e.g., 112a) may deposited on the first electron transport layer (e.g., 110a). The description associated with FIGS. 7-14 and 19-21 are referred to above and not repeated for the sake of brevity. It will be understood that in the context of forming a single light-emitting device, the portions of the method set forth in FIGS. 7-21 regarding the formation of layers of the second light-emitting device (e.g., in FIGS. 7-14 and 19-21) may be omitted, and the steps shown and described in connection with FIGS. 15-17 may be omitted.

EXAMPLE—PRODUCTION OF A LIGHT-EMITTING DEVICE 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. A hole transport material such as TFB is dissolved in chlorobenzene is deposited on top of the hole injection layer by spin coating then baked at 80° C. to form a hole transport layer. CdSe/CdS quantum dots (25 mg/ml) passivated with a cross-linkable ligand such as 8-((3-ethyloxetan-3-yl)methoxy)octanoic acid and a photo-initiator (3 wt % OPPI) are deposited and patterned with UV exposure by the above-described deposition method shown in FIGS. 10-19. The CdSe/CdS quantum dot layer is annealed for 80° C. for 10 minutes before a 20 mg/ml solution of CTAB (Cetyl trimethylammonium bromide) is deposited upon the CdSe/CdS quantum dot layer for 1 minute. The quantum dot layer is then washed three times with 50 μl of ethanol solvent to remove organic ligands. ZnO nanoparticles are deposited on top of the emissive layer by spin coating from ethanol followed by baking at 110° C. to form an electron transport layer. 100 nm of Aluminum is thermally evaporated on top of the electron transport layer to provide a reflective cathode.

The above-described process yields a light-emitting device having a 1 mm glass substrate, 150 nm ITO anode, 50 nm PEDOT:PSS hole injection layer, 40 nm OTPD hole transport layer, a patterned 20 nm emissive layer containing CdSe/CdS QDs with compact ligands, 45 nm ZnO electron transport layer, and 100 nm Al cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A light-emitting device, comprising:
an anode;
a cathode; and
an emissive layer disposed between the anode and the cathode, the emissive layer comprising quantum dots having at an outer surface of the quantum dots both cross-linked ligands and compact ligands, the compact liqands being additional ligands other than the cross-linked ligands.

2. The light-emitting device of claim 1, wherein at least 50% of the ligands present in the emissive layer are compact ligands.

3. The light-emitting device of claim 1, wherein the compact ligands comprise at least one of short chain organic ligands, inorganic molecular ligands, and inorganic ion ligands.

4. The light-emitting device of claim 1, wherein before crosslinking, the ligands that form the cross-linked ligands comprise a UV-crosslinking functional group and an exchangeable binding functional group.

5. The light-emitting device of claim 1, wherein the light-emitting device is a first light-emitting device provided in a first sub-pixel region of a sub-pixel arrangement of light-emitting devices, the sub-pixel arrangement further comprising:
a second light-emitting device provided in a second sub-pixel region of the sub-pixel arrangement, the second light emitting device comprising an anode, a cathode, and an emissive layer disposed between the anode and the cathode, the emissive layer comprising quantum dots having at an outer surface of the quantum dots both cross-linked ligands and compact ligands, the compact ligands being additional ligands other than the cross-linked ligands.

6. The light-emitting device of claim 4, wherein the exchangeable binding functional group is selected from a carboxylic acid and a thiol.

7. The light-emitting device of claim 4, wherein the UV-crosslinking functional group is selected from an oxetan and a vinylbenzyl.

8. The light-emitting device of claim 3, wherein the compact ligands comprise short organic chain ligands having hydrocarbon chains of less than eight carbon atoms.

9. The light-emitting device of claim 3, wherein the compact ligands comprise a metal-organic complex.

10. The light-emitting device of claim 3, wherein the inorganic ion ligand is selected from a halide, a chalcogenide, and a thiocyanate.

11. The light-emitting device of claim 1, further comprising a hole transport layers disposed between the anode and the emissive layer.

12. The light-emitting device of claim 1, further comprising an electron transport layer disposed between the cathode and the emissive layer.

* * * * *